United States Patent
Ziegler et al.

(10) Patent No.: US 11,108,128 B2
(45) Date of Patent: Aug. 31, 2021

(54) CIRCUIT BOARD FOR HF APPLICATIONS INCLUDING AN INTEGRATED BROADBAND ANTENNA

(71) Applicant: AIRBUS DEFENCE AND SPACE GMBH, Taufkirchen (DE)

(72) Inventors: Volker Ziegler, Hohenbrunn (DE); Enric Miralles Navarro, Munich (DE)

(73) Assignee: Airbus Defence and Space GmbH, Taufkirchen (DE)

( * ) Notice: Subject to any disclaimer, the term of this patent is extended or adjusted under 35 U.S.C. 154(b) by 820 days.

(21) Appl. No.: 15/381,873

(22) Filed: Dec. 16, 2016

(65) Prior Publication Data
US 2017/0179607 A1  Jun. 22, 2017

(30) Foreign Application Priority Data
Dec. 16, 2015 (DE) .................. 10 2015 225 496.8

(51) Int. Cl.
| | |
|---|---|
| *H01P 5/107* | (2006.01) |
| *H01P 3/12* | (2006.01) |
| *H05K 1/02* | (2006.01) |
| *H01Q 13/02* | (2006.01) |
| *H01Q 1/22* | (2006.01) |
| *H01Q 1/38* | (2006.01) |
| *H01Q 9/04* | (2006.01) |
| *B33Y 80/00* | (2015.01) |

(52) U.S. Cl.
CPC .............. *H01P 3/121* (2013.01); *H01P 5/107* (2013.01); *H01Q 1/2283* (2013.01); *H01Q 1/38* (2013.01); *H01Q 9/0414* (2013.01); *H01Q 13/02* (2013.01); *H01Q 13/0283* (2013.01); *H05K 1/0237* (2013.01); *B33Y 80/00* (2014.12); *H05K 1/0243* (2013.01); *H05K 2201/10098* (2013.01); *H05K 2201/10446* (2013.01)

(58) Field of Classification Search
CPC ... H01P 5/107; H01Q 13/0283; H01Q 1/2283
See application file for complete search history.

(56) References Cited

U.S. PATENT DOCUMENTS

| | | |
|---|---|---|
| 6,185,354 B1 | 2/2001 | Kronz et al. |
| 2010/0060537 A1* | 3/2010 | Nagayama ............. H01Q 1/247 343/776 |
| 2010/0214185 A1 | 8/2010 | Sammoura et al. |
| 2014/0285289 A1 | 9/2014 | Herbsommer et al. |
| 2015/0201499 A1 | 7/2015 | Shinar et al. |

(Continued)

OTHER PUBLICATIONS

European Search Report for Application No. 16198697.1 dated Apr. 26, 2017.
(Continued)

*Primary Examiner* — Daniel Munoz
(74) *Attorney, Agent, or Firm* — Jenkins, Wilson, Taylor & Hunt, P.A.

(57) ABSTRACT

A circuit board includes a substantially planar component carrier and a microstrip which is applied to a surface of the component carrier. The microstrip extends towards a connection transition which is arranged on a lateral edge of the component carrier. A waveguide portion of an antenna element which is produced by a 3D printing process is coupled to this connection transition.

18 Claims, 2 Drawing Sheets

(56) References Cited

U.S. PATENT DOCUMENTS

2015/0295651 A1 10/2015 Herbsommer et al.
2016/0126610 A1* 5/2016 Kawamura ............. H01P 5/107
333/26

OTHER PUBLICATIONS

European Office Action for Application No. 16198697.1 dated May 29, 2018.
German Office Action for Application No. 102015225496 dated Aug. 1, 2016.
Schulwitz, et al., "A compact millimeter-wave horn antenna array fabricated through layer-by-layer stereolithography", IEEE Antennas and Propagat. Soc. Int. Symp., Jul. 5-11, 2008.
"Design and Test of a 3D Printed Horn Antenna", Copper Mountain Technologies Whitepaper, Oct. 2015 (https://www.coppermountaintech.com/content/docs/library/3D_printing_horn_antenna-AMTA-web.pdf).

* cited by examiner

CIRCUIT BOARD FOR HF APPLICATIONS INCLUDING AN INTEGRATED BROADBAND ANTENNA

CROSS-REFERENCE TO RELATED APPLICATION

This application claims priority to German Patent Application DE 10 2015 225 496.8 filed Dec. 16, 2015, the entire disclosure of which is incorporated by reference herein.

TECHNICAL FIELD

The present disclosure relates to a circuit board for HF applications, comprising an integrated broadband antenna, in particular comprising an integrated horn antenna which has been produced in a 3D printing process.

BACKGROUND

In high-frequency (HF) applications, broadband antenna elements are conventionally connected to the circuit boards which are used in HF applications of this type by plug-in connections. Integrated antenna elements, such as planar antenna elements which are manufactured in circuit board technology, frequently do not have the bandwidth required or desired for the respective HF applications. Proposals for integrating broadband antenna elements in circuit boards comprising integrated waveguides can be found for example in the documents U.S. Pat. No. 6,185,354 B1 and US 2010/0214185 A1.

Stereolithography (SLA), selective laser sintering (SLS) and selective laser melting (SLM) belong to the group of generative manufacturing processes and are also commonly referred to as "3D printing processes". In this case, data sets are generated on the basis of geometrical models, which sets are used in a specific generative manufacturing system for producing objects having a predefined shape from shapeless materials such as liquids and powders or neutrally shaped semi-finished products such as strip-shaped, wire-shaped or web-shaped material by chemical and/or physical processes. 3D printing processes use additive processes in which the starting material is sequentially constructed layer by layer in predefined shapes.

3D printing processes are currently widely used in the production of prototypes or in rapid product development (RPD), in which a resource-efficient process chain is used for small and large-batch production, according to demand, of individualized components. 3D printing processes have various uses in civil engineering, architecture, dental technology, tool manufacturing, implantology, industrial design, the automotive industry, and in the aviation and aerospace industry.

3D printers and in particular laser sintering devices use both a computer-aided design (CAD) system and a beam system which carries out the generative build-up of layers of the object to be printed based on the digital production model provided by the CAD system. A three-dimensional CAD model of the object to be printed is in this case subjected to a preparation procedure which is carried out in order to generate the control data which is required for the beam system, the procedure being known as "slicing". In this case, the CAD model is digitally broken down into layers of a predetermined uniform thickness having layer normals along the construction direction of the beam system, which layers then form the basis for controlling the energy beam on the starting material surface in the beam system. In this case, a conventional layer breakdown algorithm forms the CAD model on an inlaid surface model, which results in a number of closed curves or surface polygons which define the "slices" between two model sections which perpendicularly succeed one another through the construction direction of the beam system.

Surface models of this type can be stored for example in STL format, which is conventional for stereolithography and which describes the surface geometry of the three-dimensional object to be printed in the form of raw data having unstructured triangle textures. The beam system reads the surface model data and converts the data into a corresponding control pattern for the laser beam in an SLA, SLS or SLM manufacturing process.

3D printing processes such as SLA, SLS or SLM result in significant design freedom in terms of geometrical shape and structure when manufacturing complex three-dimensional assembly parts and components. Therefore, 3D printing processes are in principle suitable for manufacturing broadband antenna elements such as horn antennas for transverse electromagnetic waves, which are known as TEM horn antennas. The documents Schulwitz L; Mortazawi, A.: "A compact millimeter-wave horn antenna array fabricated through layer-by-layer stereolithography", IEEE Antennas and Propagat. Soc. Int. Symp., 5-11 Jul. 2008 and "Design and Test of a 3D Printed Horn Antenna", Copper Mountain Technologies Whitepaper, October 2015 (https://www.coppermountaintech.com/content/docs/library/3D printing_horn_antenna-AMTA-web.pdf) show horn antennas of this type which are produced in 3D printing processes. US 2015/0201499 A1 discloses 3D printing processes for producing functional components for printed circuit boards (PCBs).

SUMMARY

One of the objects of the present disclosure is therefore that of finding solutions for integrating antenna elements in circuit boards for HF applications in which electromagnetic waves can be guided in the broadest band possible from the circuit board to the antenna elements.

This and other objects are achieved by a circuit board having features disclosed herein, a first production method for a circuit board having features disclosed herein, a circuit board having features disclosed herein, and a second production method for a circuit board having features disclosed herein.

According to a first aspect of the present disclosure, a first printed circuit board (PCB) comprises a substantially planar component carrier and a microstrip, which is applied to a surface of the component carrier. The microstrip extends towards a connection transition which is arranged on a lateral edge of the component carrier. A waveguide portion of an antenna element which is produced by a 3D printing process is coupled to this connection transition.

According to a second aspect of the present disclosure, a first production method for a circuit board comprises the steps of generatively manufacturing an antenna element comprising a waveguide portion and a beam funnel portion by a 3D printing process, connecting the antenna element to a substantially planar component carrier, applying a microstrip to a surface of the component carrier which extends towards a connection transition which is arranged on a lateral edge of the component carrier, and coupling the antenna element to the waveguide portion at the connection transition of the component carrier.

According to a third aspect of the present disclosure, a second printed circuit board (PCB) comprises an antenna element which is produced by a 3D printing process and comprises a waveguide portion and a substantially planar component carrier portion which is formed integrally with the waveguide portion. A microstrip is applied to a surface of the component carrier portion and extends towards a connection transition which is arranged on a lateral edge of the component carrier portion.

According to a fourth aspect of the present disclosure, a second production method for a circuit board comprises the steps of generatively manufacturing an antenna element comprising a waveguide portion, a substantially planar component carrier portion which is formed integrally with the waveguide portion, and a beam funnel portion by a 3D printing process, and applying a microstrip to a surface of the component carrier portion, which microstrip extends towards a connection transition which is arranged on a lateral edge of the component carrier portion.

One of the essential concepts of the present disclosure consists in producing antenna elements in generative, layer-by-layer manufacturing processes, referred to as "3D printing processes", and creating the design thereof in the contact and connection regions in such a way that the antenna elements cause as little change in impedance as possible in the wiring on the circuit boards in the case of connection to corresponding connection regions of circuit boards for HF applications. In particular in the case of circuit boards having microstrips applied thereto, high-frequency electromagnetic waves can thus be guided over the connection point of the antenna elements with very low reflection and thus guided from the microstrips to the antenna with minimal losses.

3D printing processes for producing the antenna elements are therefore advantageous in particular because the processes allow the production of three-dimensional components in primary shaping processes without requiring a specific manufacturing tool which is adapted to the external shape of the components. Highly efficient, material-saving and time-saving production processes for components are possible as a result. 3D printing processes of this type are particularly advantageous for antenna elements, since the geometry of the various functional components of the antenna elements can be specifically adapted in the manufacturing systems required for the production, at a low cost, in a short manufacturing lead time, and in an uncomplicated manner, to the sometimes highly contrasting requirements, such as radiation characteristics, frequency response, input impedance or directional characteristics in 3D printing processes of this type.

In 3D printing processes, antenna elements can in some cases also be produced having component carriers or parts of component carriers integrally formed thereon. As a result, problems in connecting antenna elements to connection regions of separate component carriers are completely eliminated, and the change in impedance at the waveguide portion can be advantageously kept to a minimum.

Furthermore, according to the present disclosure, it is possible to integrate extremely broadband antennas and antenna arrays in circuit boards in such a way that an advantageous, compact construction of circuit boards of this type is possible. Circuit boards for HF applications having small spatial dimensions are especially suitable in particular for use in high-frequency circuit parts, are known as HF front-end modules, for example in mobile communication devices.

Furthermore, by the integration of the generatively manufactured antenna elements, it is possible to circumvent limitations in the broadband capacity which would occur owing to connection measures such as plug-in connections. By a suitable and adapted design of the antenna elements, specific parts of the antenna elements in the region of the connections to the circuit boards can also take on functions for the mechanical stabilisation of the entire construction so as to facilitate the connection of the antenna elements and save on material costs.

Advantageous embodiments and developments are disclosed in the description with reference to the figures.

According to one embodiment of the first circuit board according to the present disclosure, the antenna element can comprise a microstrip segment which is applied to the waveguide portion and extends on the waveguide portion as an extension of the microstrip of the component carrier. In this case, the microstrip and the microstrip segment can form a waveguide transition on the lateral edge of the component carrier.

According to another embodiment of the first circuit board according to the present disclosure, the microstrip and the microstrip segment can be electrically connected at the waveguide transition by a soldered connection or a bonding wire.

According to another embodiment of the first circuit board according to the present disclosure, the antenna element can be a horn antenna which comprises a beam funnel portion which adjoins the waveguide portion.

According to another embodiment of the first circuit board according to the present disclosure, the component carrier can comprise at least two circuit board substrates which are stacked one on top of the other. In this case, the antenna element can be connected to the waveguide portion at a lower of the at least two circuit board substrates which are stacked one on top of the other.

According to another embodiment of the first circuit board according to the present disclosure, the circuit board can additionally comprise a fixing plate which mechanically connects the waveguide portion of the antenna element to the component carrier.

Alternatively, the waveguide portion of the antenna element can be welded or bonded to the component carrier. In another alternative embodiment, it can also be possible for the waveguide portion of the antenna element to be integrally formed on the component carrier by the 3D printing process.

According to a different embodiment of the production method according to the present disclosure, the connection of the antenna element to the component carrier can be carried out during the 3D printing process by forming the antenna element on the component carrier, can comprise welding or bonding the waveguide portion of the antenna element to the component carrier, or can comprise screwing or riveting a fixing plate which mechanically connects the waveguide portion of the antenna element to the component carrier.

Where appropriate, the embodiments and developments above can be combined with one another as desired. Further possible embodiments, developments and implementations of the present disclosure also comprise not explicitly mentioned combinations of features of the present disclosure described previously or in the following with reference to the embodiments. In particular, in the process a person skilled in the art will also add individual aspects as improvements or additions to the relevant basic form of the present disclosure.

BRIEF DESCRIPTION OF THE DRAWINGS

The present disclosure will be described in greater detail below on the basis of the embodiments shown in the schematic drawings, in which.

Figure 1:
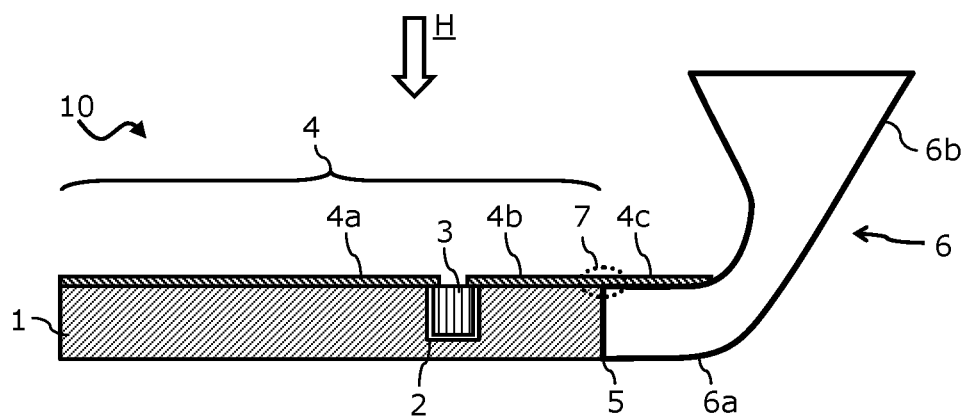
FIG. 1 is a schematic illustration of the sectional view of a circuit board for HF applications comprising an integrated antenna element according to one embodiment of the present disclosure.

The accompanying figures are intended to provide further understanding of the embodiments of the present disclosure. The figures illustrate embodiments and are used, in conjunction with the description, to explain principles and concepts of the present disclosure. Other embodiments and many of the above-mentioned advantages emerge from the drawings. The elements of the drawings are not necessarily shown to scale with respect to one another. Terminology indicating directions such as "top", "bottom", "left", "right", "over", "under", "horizontal", "vertical", "front", "rear" and similar specifications are used merely for explanatory purposes and are not used to limit the generality to specific configurations as shown in the drawings.

In the figures of the drawings, elements, features and components which are like, functionally like or have the same effect are each provided with the same reference numerals unless otherwise specified.

DETAILED DESCRIPTION 3D printing processes within the meaning of the present application include all generative manufacturing processes in which, based on geometrical models, objects having a predefined shape are produced in a specific generative manufacturing system from shapeless materials such as liquids and powders or neutrally shaped semi-finished products such as strip-shaped, wire-shaped or web-shaped material by chemical and/or physical processes. 3D printing processes within the meaning of the present application use additive processes in which the starting material is sequentially constructed layer by layer in predefined shapes. 3D printing processes comprise in particular stereolithography (SLA), selective laser sintering (SLS), selective laser melting (SLM), fused deposition modelling (FDM) or fused filament fabrication (FFF), and electron beam melting (EBM).

Figure 2:
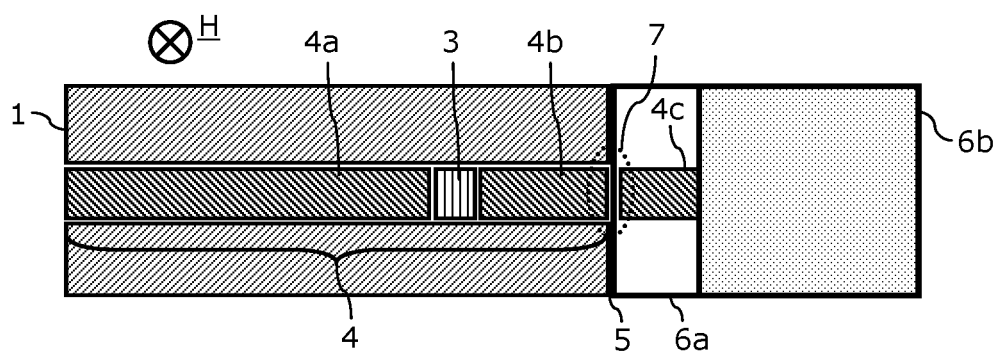
FIG. 2 is a schematic illustration of the plan view of the circuit board from FIG. 1.

FIG. 1 is a schematic illustration of the sectional view of a circuit board 10 for HF applications. FIG. 2 is a plan view from above of the circuit board 10 of FIG. 1, denoted by the reference sign "H". In this case, the circuit board 10 comprises an integrated antenna element 6, for example a horn antenna for transverse electromagnetic (TEM) waves. However, it should be clear in this case that the design of the antenna element 6 is not restricted to horn antennas, but rather other forms of antennas having broadband radiation characteristics can also be possible, i.e. antennas which meet a predefined standard in a frequency range with respect to specific radiation properties. Broadband antenna elements of this type can comprise for example Vivaldi antennas, reflector antennas, cone antennas, helical antennas, YAGI antennas or travelling-wave antennas.

The horn antenna 6 in FIG. 1 in principle comprises a waveguide portion 6a which seamlessly adjoins a beam funnel portion 6b. The waveguide portion 6a can have a rectangular hollow profile and can be used as a waveguide having a gaseous dielectric medium. Depending on the desired beam properties, the beam funnel portion 6b can also have a rectangular cross section. In addition, the beam funnel portion 6b can have a ridged horn funnel, an exponential horn funnel or any other desired suitable funnel shape.

The antenna element 6, and in FIG. 1 in particular the horn antenna, has in this case been generatively manufactured in a 3D printing process. For this purpose, the antenna element 6 can be printed for example from an electrically conductive material. However, it can also be possible to print the antenna element 6 from a substantially electrically insulating material and to coat the inner and/or outer walls of the printed antenna body with an electrically conductive material.

The antenna element 6 can in particular comprise a beam funnel portion 6b which is formed integrally with a waveguide portion 6a. The waveguide portion 6a can have a rectangular cross section for example. The beam funnel portion 6b can, as shown in FIG. 1 to 6, be angled upwards, i.e. by 90° with respect to the circuit board 10. The antenna element 6 can comprise a microstrip segment 4c which is applied to the waveguide portion 6a. The microstrip segment 4c acts as an extension of a microstrip which feeds the electromagnetic waves from the circuit board into the antenna element 6. For this purpose, the microstrip segment 4c can extend on the waveguide portion 6a as an extension of the microstrip of the component carrier 1.

The component carrier 1 of the circuit board 10 is substantially planar and comprises a main surface to which one or more microstrips 4 are applied. The microstrips 4 are used to guide electromagnetic waves on the component carrier 1. In order to integrate chips or other electronic components for signalling (a HF chip 3 is shown in the drawings by way of example), the microstrip 4 can be divided up into various microstrip portions 4a, 4b. The HF chip 3 can be embedded for example in a recess 2 in the surface of the component carrier 1 so as not to substantially impair the waveguide properties of the microstrip portions 4a, 4b.

At least one of the microstrip portions 4b extends over the surface of the component carrier 1 towards a connection transition 5 which is arranged on a lateral edge of the component carrier 1. The connection transition 5 is used for coupling the antenna element 6, the waveguide portion 6a of which is coupled to the connection transition 5 of the component carrier 1. In this case, the microstrip portion 4b is designed in relation to the microstrip segment 4c on the lateral edge of the component carrier 1 in such a way that the microstrips 4b and 4c form a waveguide transition 7. For example, the microstrip portion 4b and the microstrip segment 4c can be electrically connected at the waveguide transition 7 by a soldered connection or a bonding wire, as shown schematically in FIG. 1.

The waveguide portion 6a of the antenna element 6 can be welded or bonded to the component carrier 1. It can also be possible to integrally form the waveguide portion 6a of the antenna element 6 on the component carrier 1 as part of a 3D printing process, for example as part of the production method which is used for generatively manufacturing the antenna element 6. In this case, the component carrier 1 itself can be used as an initial substrate for the 3D printing process, on which substrate the antenna element 6 is constructed layer by layer.

Figure 3:
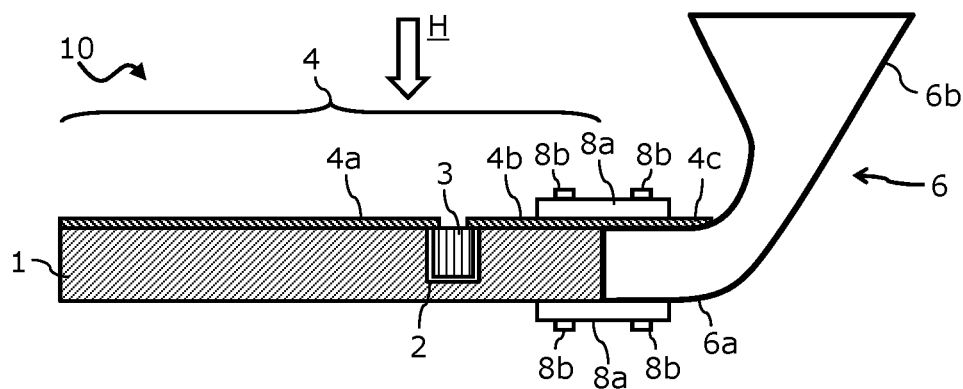
FIG. 3 is a schematic illustration of the sectional view of a circuit board for HF applications comprising an integrated antenna element according to another embodiment of the present disclosure.
Figure 4:
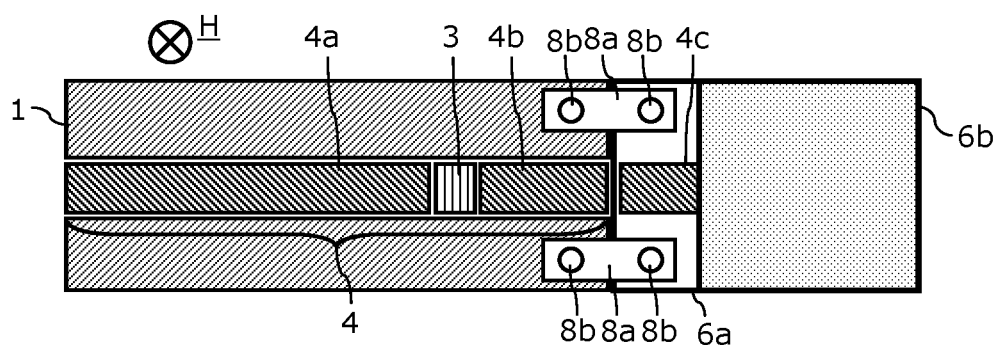
FIG. 4 is a schematic illustration of the plan view of the circuit board from FIG. 3.

FIG. 3 is a schematic illustration of the sectional view of a circuit board 10 for HF applications. FIG. 4 is a plan view from above of the circuit board 10, denoted by the reference sign "H". The circuit board 10 in FIGS. 3 and 4 differs from the circuit board shown in FIGS. 1 and 2 in that fixing plates 8a are provided which mechanically connect the waveguide portion 6a of the antenna element 6 to the component carrier 1. For this purpose, for example a fixing plate 8a can be arranged on the lower surface and the upper surface, respectively, of the component carrier 1, and the fixing plates 8a can be screwed or riveted to one another by fixing pins, studs or screws.

Figure 5:
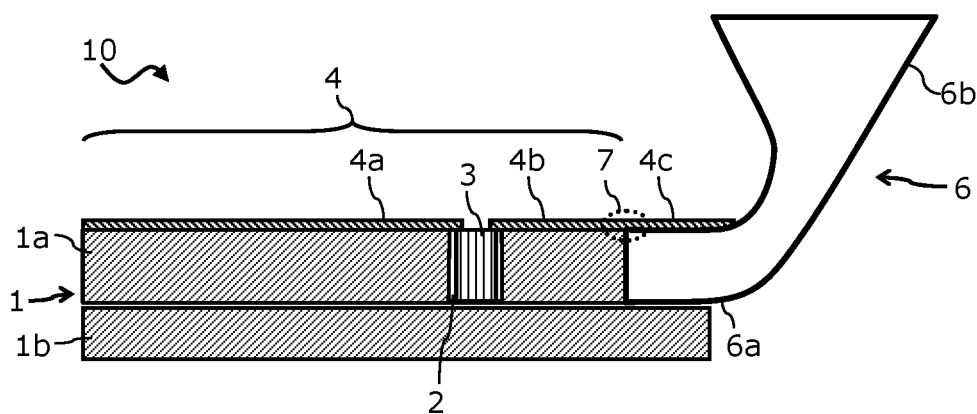
FIG. 5 is a schematic illustration of the sectional view of a circuit board for HF applications comprising an integrated antenna element according to yet another embodiment of the present disclosure.

FIG. 5 is a schematic illustration of the sectional view of a circuit board 10 for HF applications, in which, by contrast with the circuit boards 10 in FIG. 1 to 4, the component carrier 1 comprises at least two circuit board substrates 1a, 1b which are stacked one on top of the other. In the case of multilayer construction processes of this type, the circuit board substrates 1a, 1b can be layered so as to be offset from one another, thereby resulting in a connection region on the lower of the two circuit board substrates 1a, 1b which are stacked one on top of the other, to which region the waveguide portion 6a can be applied in a mechanically stable manner.

Figure 6:
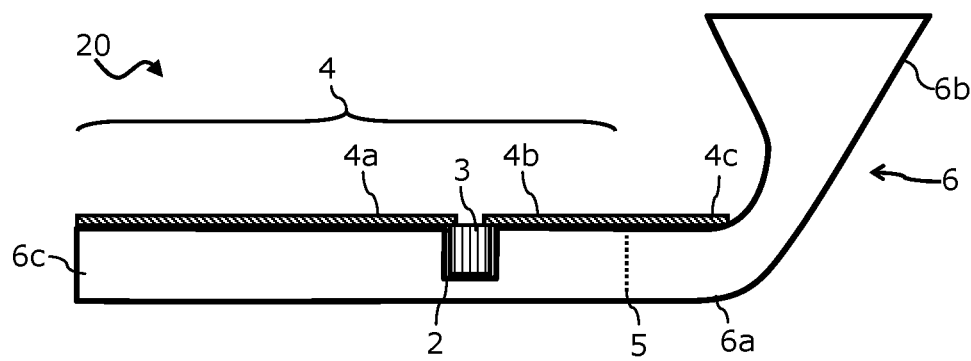
FIG. 6 is a schematic illustration of the sectional view of a circuit board for HF applications comprising an integrated antenna element according to yet another embodiment of the present disclosure.

FIG. 6 is a schematic illustration of the sectional view of another circuit board 20 for HF applications. By contrast with the circuit boards 10 in FIG. 1 to 5, an antenna element 6 is produced for the circuit board 20 by a 3D printing process, so that the element comprises, in addition to the waveguide portion 6a and optionally the beam funnel portion 6b, a substantially planar component carrier portion 6c which is formed integrally with the waveguide portion 6a. The component carrier portion 6c is then used as a component carrier instead of a conventional PCB substrate. By forming the component carrier portion 6c integrally with the waveguide portion 6a, the impedance of the two portions 6a, 6c at the connection transition 5 can be adapted whilst optimally preventing reflection losses when electromagnetic waves are fed into the waveguide portion 6a.

Microstrip portions 4a, 4b which are applied to a surface of the component carrier portion 6c and which extend towards the connection transition 5 can be coupled without any difficulty to a microstrip segment 4c which extends on the waveguide portion 6a as an extension of the microstrip 4a, 4b of the component carrier portion 1.

Figure 7:
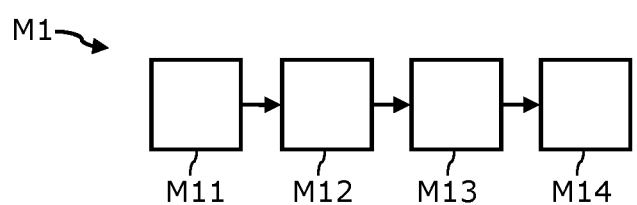
FIG. 7 is a block diagram of a first 3D printing method according to a further embodiment of the present disclosure.
Figure 8:
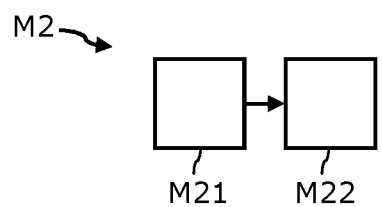
FIG. 8 is a block diagram of a second 3D printing process according to a further embodiment of the present disclosure.

FIGS. 7 and 8 are each schematic block diagrams of production methods M1 and M2 for circuit boards. In this case, the production methods can be used in particular for producing circuit boards 10 and 20 according to FIG. 1 to 6. The production method M1 is used in this case to produce a circuit board 10. In this case, an antenna element 6 comprising a waveguide portion 6a and a beam funnel portion 6b is firstly generatively manufactured by a 3D printing process in a step M11. In a step M12, the antenna element 6 is connected to a substantially planar component carrier 1. Lastly, in step M13, a microstrip 4a, 4b is applied to a surface of the component carrier 1, which microstrip extends towards a connection transition 5 which is arranged on a lateral edge of the component carrier 1 and, in a step M14, the antenna element 6 is coupled to the waveguide portion 6a at the connection transition 5 of the component carrier 1.

In step M12, the connection of the antenna element 6 to the component carrier 1 can take place in the course of the 3D printing process by integrally forming the antenna element on the component carrier 1. Alternatively, the antenna element 6 can also be welded or bonded to the component carrier 1, or one or more fixing plates 8a can be used which mechanically connect the waveguide portion 6a of the antenna element 6 to the component carrier 1.

In contrast, the production method M2 is used to produce a circuit board 20 as shown in FIG. 6. In this case, an antenna element 6 comprising a waveguide portion 6a, a substantially planar component carrier portion 6c which is formed integrally with the waveguide portion 6a, and a beam funnel portion 6b is firstly generatively manufactured by a 3D printing process in a first step M21. In a step M22, a microstrip 4a, 4b is then applied to a surface of the component carrier portion 1. The microstrip 4a, 4b extends towards a connection transition 5 which is arranged on a lateral edge of the component carrier portion 6c.

The described circuit boards 10, 20 and the production methods M1, M2 thereof can be used in radio frequency front end (RFFE) for transmitters and receivers in microwave communication devices, satellite communication devices, WiFi devices, portable communication devices such as smartphones or tablets and similar communication devices.

In the detailed description above, various features for improving the conclusiveness of the presentation have been summarised in one or more examples. However, it should be clear in this case that the above description is of a purely illustrative, but in no way limiting, nature. The description is used to cover all alternatives, modifications and equivalents of the various features and embodiments. Many other examples are immediately clear to a person skilled in the art in view of the above description due to their specialised knowledge.

The embodiments have been selected and described in order to be able to show, as well as possible, principles on which the invention is based and the possible applications thereof in practice. Consequently, persons skilled in the art can modify and use the invention and the various embodiments thereof in an optimal manner with respect to the intended use. In the claims and the description. While at least one exemplary embodiment of the present invention(s) is disclosed herein, it should be understood that modifications, substitutions and alternatives may be apparent to one of ordinary skill in the art and can be made without departing from the scope of this disclosure. This disclosure is intended to cover any adaptations or variations of the exemplary embodiment(s). In addition, in this disclosure, the terms "comprise" or "comprising" do not exclude other elements or steps, the terms "a" or "one" do not exclude a plural number, and the term "or" means either or both. the terms "containing" and "comprising" are used as neutral linguistic terminology for the corresponding term "including". Furthermore, characteristics or steps which have been described may also be used in combination with other characteristics or steps and in any order unless the disclosure or context suggests otherwise. This disclosure hereby incorporates by reference the complete disclosure of any patent or application from which it claims benefit or priority.

What is claimed is:

1. A circuit board comprising:
    a substantially planar component carrier;
    a microstrip applied to a surface of the component carrier and extending towards a connection transition, which is arranged on a lateral edge of the component carrier; and
    an antenna element produced by a 3D printing process and comprising a waveguide portion with a rectangular hollow cross section, which is coupled to the connection transition of the component carrier.

2. The circuit board of claim 1, wherein the antenna element comprises a microstrip segment which is applied to the waveguide portion and extends on the waveguide portion as an extension of the microstrip of the component carrier.

3. The circuit board of claim 2, wherein the microstrip and the microstrip segment form a waveguide transition on the lateral edge of the component carrier.

4. The circuit board of claim 3, wherein the microstrip and the microstrip segment are electrically connected at the waveguide transition by a soldered connection or a bonding wire.

5. The circuit board of claim 1, wherein the antenna element is a horn antenna which comprises a beam funnel portion which adjoins the waveguide portion.

6. The circuit board of claim 1, wherein the component carrier comprises at least two circuit board substrates which are stacked one on top of the other.

7. The circuit board of claim 6, wherein the antenna element is connected to the waveguide portion at a lower of the at least two circuit board substrates which are stacked one on top of another.

8. The circuit board of claim 1, further comprising:
    a fixing plate which mechanically connects the waveguide portion of the antenna element to the component carrier.

9. The circuit board of claim 1, wherein the waveguide portion of the antenna element is welded or bonded to the component carrier.

10. The circuit board of claim 1, wherein the waveguide portion of the antenna element is integrally formed on the component carrier by the 3D printing process.

11. A production method for a circuit board, the method comprising:
    generatively manufacturing an antenna element comprising a waveguide portion and a beam funnel portion by a 3D printing process, the waveguide portion having a rectangular hollow cross section;
    connecting the antenna element to a substantially planar component carrier;
    applying a microstrip to a surface of the component carrier which extends towards a connection transition which is arranged on a lateral edge of the component carrier; and
    coupling the antenna element to the waveguide portion at the connection transition of the component carrier.

12. The production method of claim 11, wherein connection of the antenna element to the component carrier takes place during the 3D printing process by forming the antenna element on the component carrier.

13. The production method of claim 11, wherein connection of the antenna element to the component carrier comprises welding or bonding the waveguide portion of the antenna element to the component carrier.

14. The production method of claim 11, wherein connection of the antenna element to the component carrier comprises screwing or riveting a fixing plate, which mechanically connects the waveguide portion of the antenna element to the component carrier.

15. A circuit board comprising:
    an antenna element which is produced by a 3D printing process and comprises a waveguide portion with a rectangular hollow cross section and a substantially planar component carrier portion which is formed integrally with the waveguide portion; and
    a microstrip which is applied to a surface of the component carrier portion and which extends towards a connection transition which is arranged on a lateral edge of the component carrier portion.

16. The circuit board of claim 15, wherein the antenna element comprises a microstrip segment which is applied to the waveguide portion and extends on the waveguide portion as an extension of the microstrip of the component carrier portion.

17. The circuit board of claim 15, wherein the antenna element is a horn antenna which comprises a beam funnel portion which adjoins the waveguide portion.

18. A production method for a circuit board, the method comprising:
    generatively manufacturing an antenna element comprising a waveguide portion with a rectangular hollow cross section, a substantially planar component carrier portion which is formed integrally with the waveguide portion, and a beam funnel portion by a 3D printing process; and
    applying a microstrip to a surface of the component carrier portion which extends towards a connection transition which is arranged on a lateral edge of the component carrier portion.

* * * * *